(12) United States Patent
Park et al.

(10) Patent No.: US 9,171,976 B2
(45) Date of Patent: Oct. 27, 2015

(54) LIGHT DETECTION DEVICE

(71) Applicant: SEOUL VIOSYS CO., LTD., Ansan-si (KR)

(72) Inventors: Ki Yon Park, Ansan-si (KR); Hwa Mok Kim, Ansan-si (KR); Young Hwan Son, Ansan-si (KR); Daewoong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/140,054

(22) Filed: Dec. 24, 2013

(65) Prior Publication Data

US 2014/0183548 A1 Jul. 3, 2014

(30) Foreign Application Priority Data

Dec. 28, 2012 (KR) .................. 10-2012-0157424

(51) Int. Cl.
| | | |
|---|---|---|
| H01L 29/15 | (2006.01) | |
| H01L 27/15 | (2006.01) | |
| H01L 31/102 | (2006.01) | |
| H01L 21/00 | (2006.01) | |
| H01L 31/0304 | (2006.01) | |
| H01L 31/108 | (2006.01) | |
| H01L 31/18 | (2006.01) | |

(52) U.S. Cl.
CPC ........ *H01L 31/03048* (2013.01); *H01L 31/108* (2013.01); *H01L 31/1848* (2013.01)

(58) Field of Classification Search
CPC ............. H01L 31/03044; H01L 31/0304; H01L 31/1013; H01L 31/03046; H01L 31/03048; H01L 21/02458; H01L 21/0254; H01L 33/007; H01L 29/2003; H01L 31/00; H01L 31/07; H01L 31/109; H01L 31/108
USPC ............... 257/76, 43, 448, 185, 79, 184, 449, 257/453; 438/48, 29, 478, 47

See application file for complete search history.

(56) References Cited

U.S. PATENT DOCUMENTS

| | | | | |
|---|---|---|---|---|
| 6,104,074 | A * | 8/2000 | Chen .............................. | 257/453 |
| 6,137,123 | A * | 10/2000 | Yang et al. .................... | 257/184 |
| 2003/0160231 | A1 * | 8/2003 | Cole et al. ....................... | 257/22 |
| 2006/0273325 | A1 * | 12/2006 | Surya ............................... | 257/79 |
| 2008/0087914 | A1 * | 4/2008 | Li et al. .......................... | 257/184 |
| 2009/0269867 | A1 * | 10/2009 | Shakuda ......................... | 438/29 |
| 2011/0049566 | A1 * | 3/2011 | Perera et al. .................. | 257/185 |

OTHER PUBLICATIONS

Ko et al, "AlGaN/GaN Schottky-barrier UV-B bandpass photodetectors with ITO contacts and LT-GaN cap layers", Semicond. Sci. Technol. 21, pp. 1064-1068 (2006).*

* cited by examiner

*Primary Examiner* — Long K Tran
*Assistant Examiner* — Dzung Tran
(74) *Attorney, Agent, or Firm* — H.C. Park & Associates, PLC

(57) ABSTRACT

A light detection device includes a substrate, a buffer layer disposed on the substrate, a first band gap change layer disposed on a portion of the buffer layer, a light absorption layer disposed on the first band gap change layer, a Schottky layer disposed on a portion of the light absorption layer, and a first electrode layer disposed on a portion of the Schottky layer.

29 Claims, 13 Drawing Sheets

LIGHT DETECTION DEVICE

CROSS-REFERENCE(S) TO RELATED APPLICATIONS

This application claims priority to Korean Patent Application No. 10-2012-0157424, filed on Dec. 28, 2012, which is(are) incorporated herein by reference in its(their) entirety.

BACKGROUND OF THE INVENTION

1. Field of the Invention

Exemplary embodiments of the present invention relate to a light detection device; and, particularly, to a light detection device that reduces current flow resistance due to an abrupt energy band gap change between a buffer layer and a light absorption layer, through the application of a multilayer band gap change layer having different energy band gaps.

2. Description of Related Art

Ultraviolet (UV) light has a shorter wavelength than the visible light, and was discovered for the first time by the German Chemist, J. W. Ritter, in 1801.

Here, UV radiation is defined as electromagnetic waves with a broad spectrum of wavelengths of about 397 to 10 nm, and the UV radiation with extremely short wavelength does not get distinguished easily with X-rays. Further, since the UV radiation is characterized by powerful chemical reactions, it is also called actinic rays, while infrared radiation is called heat rays.

The UV radiation with the wavelength of 400 nm or less is divided into several bands by wavelengths—UVA, UVB, and UVC. UVA measures 320 to 400 nm, corresponds to about 98% or more of sunlight that reaches the earth's surface, and negatively affects human skin, such as melanism or premature skin aging. UVB measures 280 to 320 nm, corresponds to about 2% of sunlight that reaches the earth's surface, and severely affects the human body, such as by causing skin cancers, cataracts, or erythema phenomenon. The UVB radiation is mostly absorbed by the ozone layer. However, due to destruction of the ozone layer, the amount of UVB radiation that reaches the earth's surface has been increased in many areas, and this causes severe environmental problems. UVC measures 200 to 280 nm, is all absorbed in the atmosphere, and thus, scarcely reaches the earth's surface. The UVC is mainly used for bacteriocidal action. The representative quantification of UV radiation influence exerted on the human body is the UV index that is defined as the incident level of UVB radiation.

A device that can sense the UV light may be a PMT (Photo Multiplier Tube) or a semiconductor device. Since the semiconductor device is cheaper and smaller than the PMT, it has widely been used. In the semiconductor device, GaN (Gallium Nitride) or SiC (Silicon Carbide) having an energy band gap that is suitable to UV sensing, is widely used.

Particularly, in the case of a device based on GaN, a Schottky junction type, MSM (Metal-Semiconductor-Metal) type, or PIN type device has been mainly used. In particular, the Schottky junction type device is generally preferred since its fabricating process is simple.

Here, in the Schottky junction type device, a buffer layer, a light absorption layer, and a Schottky junction layer are laminated in order on different substrates, a first electrode is formed on the buffer layer or the light absorption layer, and a second electrode is formed on the Schottky junction layer.

In this case, the buffer layer may be formed of a GaN layer, and the light absorption layer may be formed of an AlGaN layer. However, if the Al content of the AlGaN layer is equal to or higher than 15%, and the thickness thereof is equal to or larger than 0.1 µm, cracks may be produced due to differences in lattice mismatch and thermal expansion coefficient between the GaN layer and the AlGaN layer, thereby reducing yields.

In order to solve this, an AlN buffer layer may be used between the GaN buffer layer and the AlGaN light absorption layer. In the case of using the AlN buffer layer, a light detection reaction is reduced, due to the high energy band gap and insulating properties of the AlN layer.

Further, in the case of using the AlGaN layer as the light absorption layer, it is difficult to form an ohmic junction directly on the AlGaN layer, due to high contact resistance, if the Al content is equal to or higher than 15%. It is also not possible to obtain uniform Schottky junction characteristics due to high Schottky junction barrier.

In addition, if the thickness of the light absorption layer is set to 0.1 µm or less to prevent the cracks, the light absorption efficiency is deteriorated due to the thin thickness of the light absorption layer, and thus, the reaction thereof is also reduced.

SUMMARY OF THE INVENTION

An exemplary embodiment of the present invention is directed to a light detection device that improves current flow prevention according to an abrupt energy band gap change of a buffer layer and a light absorption layer through application of a multilayer band gap change layer having different energy band gaps.

Another exemplary embodiment of the present invention is directed to a light detection device that uses ITO or the like as a Schottky layer to improve permeability of light to be especially detected.

Another exemplary embodiment of the present invention is directed to a light detection device in which a top layer composed of p-In$_z$Ga$_{1-z}$N (0<z<1), which is doped with Mg, is inserted into a bottom surface of a Schottky layer to facilitate Schottky characteristics of the Schottky layer.

Another exemplary embodiment of the present invention is directed to a light detection device in which a part of a Schottky layer and a part of a top layer are simultaneously contacted and fixed to each other by a Schottky fixing layer to prevent peeling of the Schottky layer due to stress during wire bonding.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a light detection device includes a substrate; a buffer layer formed on the substrate; a first band gap change layer formed on a portion of the buffer layer; a light absorption layer formed on the first band gap change layer; a Schottky layer formed on a portion of the light absorption layer; and a first electrode layer formed on a portion of the Schottky layer.

The light detection device may further include a top layer formed on the light absorption layer, wherein the Schottky layer is formed on a portion of the top layer.

The light detection device may further include a Schottky fixing layer formed on the Schottky layer to cover a part of the top layer along a border of the Schottky layer.

The light detection device may further include a second electrode layer formed on the buffer layer and spaced apart from the first band gap change layer, to form an ohmic junction with the buffer layer.

The substrate may be any one of a sapphire substrate, an SiC substrate, a GaN substrate, an AlN substrate, and an Si substrate.

The buffer layer may include a low-temperature GaN layer formed on the substrate and a high-temperature GaN layer formed on the low-temperature GaN layer.

The first band gap change layer may be formed through the lamination of a plurality of AlGaN layers having different Al contents.

The first band gap change layer may be formed through alternate lamination of a plurality of AlGaN layers having different Al contents and GaN layers.

An energy band gap of the light absorption layer may be higher than an energy band gap of the buffer layer, and Al content of the first band gap change layer may become increased as going toward an upper layer.

The light absorption layer may be formed of an AlxGa1-xN ($0<x<0.7$) layer.

The first band gap change layer may be formed through lamination of a plurality of InGaN layers having different In contents.

The first band gap change layer may be formed through alternate lamination of a plurality of InGaN layers having different In contents and GaN layers.

An energy band gap of the light absorption layer may be lower than an energy band gap of the buffer layer, and In content of the first band gap change layer may become increased as going toward an upper layer.

The light absorption layer may be formed of an InyGa1-yN ($0<y<0.5$) layer.

The light detection device may further include a second band gap change layer formed between the light absorption layer and the top layer.

The second band gap change layer may be formed through lamination of a plurality of AlGaN layers having different Al contents.

The second band gap change layer may be formed through alternate lamination of a plurality of AlGaN layers having different Al contents and GaN layers.

An energy band gap of the top layer may be lower than an energy band gap of the light absorption layer, and Al content of the second band gap change layer may become decreased as going toward an upper layer.

The top layer may be formed of a p-InzGa1-zN ($0<z<1$) layer doped with Mg, and the light absorption layer may be formed of an AlxGa1-xN ($0<x<0.7$) layer.

The second band gap change layer may be formed through lamination of a plurality of InGaN layers having different In contents.

The second band gap change layer may be formed through alternate lamination of a plurality of InGaN layers having different In contents and GaN layers.

An energy band gap of the top layer may be higher than an energy band gap of the light absorption layer, and In content of the second band gap change layer may become decreased as going toward an upper layer.

The top layer may be formed of a p-InzGa1-zN ($0<z<1$) layer doped with Mg, and the light absorption layer may be formed of an InyGa1-yN ($0<y<0.5$) layer.

The first band gap change layer may be formed with a thickness larger than 0 and equal to or smaller than 50 nm.

The light absorption layer may be formed with a thickness of 0.1 to 0.5 μm.

The second band gap change layer may be formed with a thickness larger than 0 and equal to or smaller than 20 nm.

The top layer may be formed with a thickness larger than 0 and equal to or smaller than 10 nm.

The Schottky layer may be made of any one of ITO, ATO, Pt, W, Ti, Pd, Ru, Cr, and Au.

The Schottky fixing layer may be made of any one of ITO, ATO, Pt, W, Ti, Pd, Ru, Cr, and Au.

In accordance with the light detection device according to an embodiment of the present invention, the multilayer band gap change layer having different energy band gaps is formed between the buffer layer and the light absorption layer. Accordingly, the current flow prevention according to the abrupt energy band gap change of the buffer layer and the light absorption layer is improved, the crystalline characteristics of the light absorption layer are improved, and thus the reliability of the light detection device is improved.

Further, since the multilayer band gap change layer having different energy band gaps is formed between the light absorption layer and the top layer, the current flow prevention according to the abrupt energy band gap change of the light absorption layer and the top layer is improved, the crystalline characteristics of the top layer are improved, and thus the reliability of the light detection device is improved.

Further, since the Schottky layer is made of ITO having superior light permeability as compared with Ni in the related art, the degree of reaction of the light detection device is improved.

Further, the top layer composed of p-InzGa1-zN ($0<z<1$) is formed on the bottom surface of the Schottky layer to facilitate the formation of the Schottky junction between the Schottky layer and the top layer, and the parts of the Schottky layer and the top layer are simultaneously contacted and fixed to each other through the Schottky fixing layer to overcome the stress by the wire bonding. Accordingly, the peeling phenomenon of the Schottky layer is prevented, and thus the production yield of the light detection device is improved.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
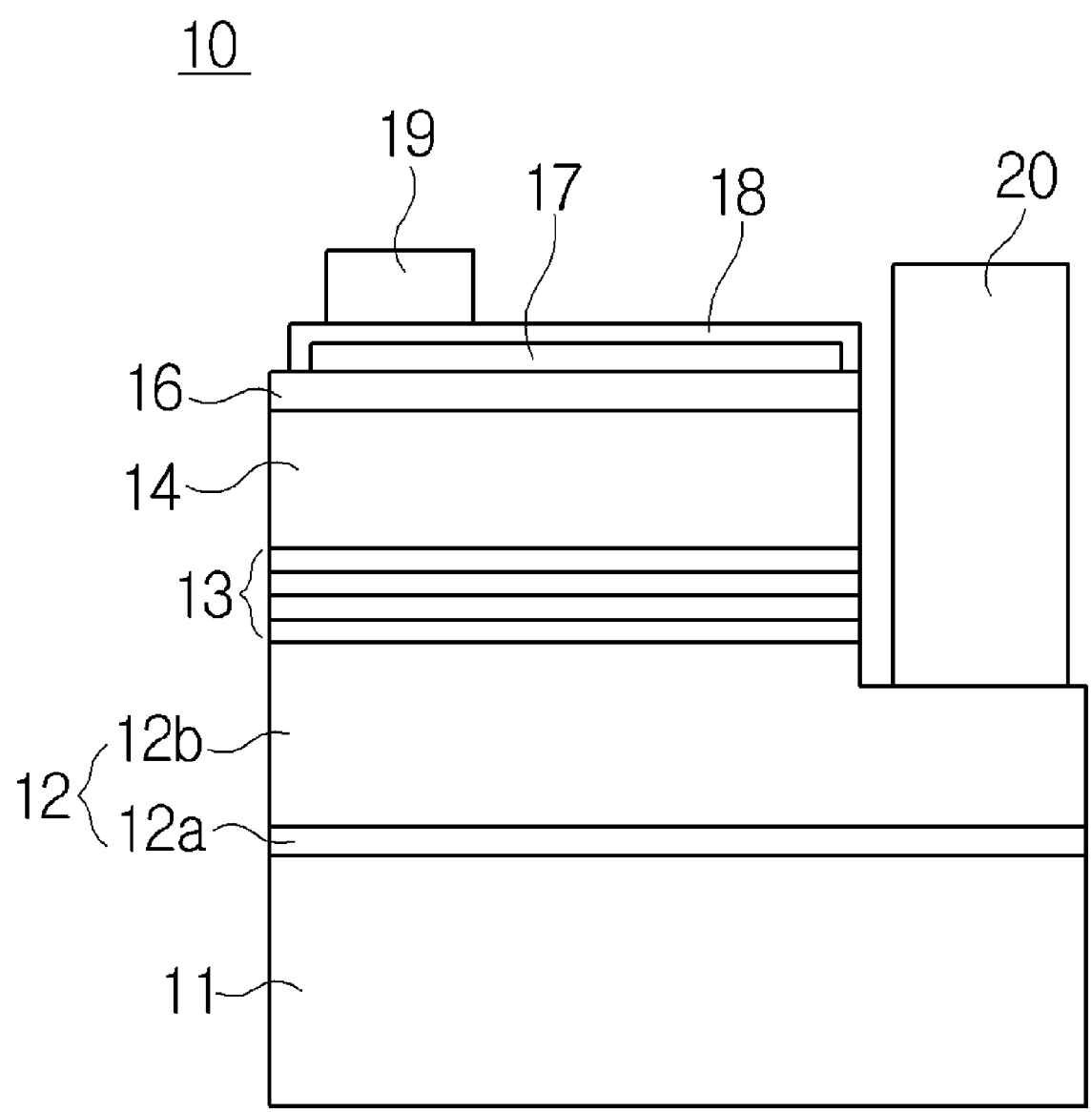
FIG. 1 is a cross-sectional view of a light detection device in accordance with an exemplary embodiment of the present invention.

Exemplary embodiments of the present invention will be described below in more detail with reference to the accompanying drawings. The drawings are not necessarily to scale and in some instances, proportions may have been exaggerated in order to clearly illustrate features of the embodiments.

Further, the following terms are defined considering functions of the present invention, and may be differently defined according to the intention of a user or an operator or custom. Therefore, the terms should be defined based on the overall contents of the specification.

For example, when a first layer is referred to as being "on" a second layer or "on" a substrate, it not only refers to a case where the first layer is formed directly on the second layer or the substrate but also a case where a third layer exists between the first layer and the second layer or the substrate. Further, in the description, the directional expressions, such as an upper side, an upper (portion), and an upper side surface, may be understood as the meanings of a lower side, a lower (portion), and a lower side surface. That is, expression of a spatial direction should be understood as a relative direction, but should not be limitedly understood as the meaning of an absolute direction.

The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the following embodiments, detection of ultraviolet light is specially described. However, the present invention may also be used for light detection in other wavelength regions.

Figure 2:
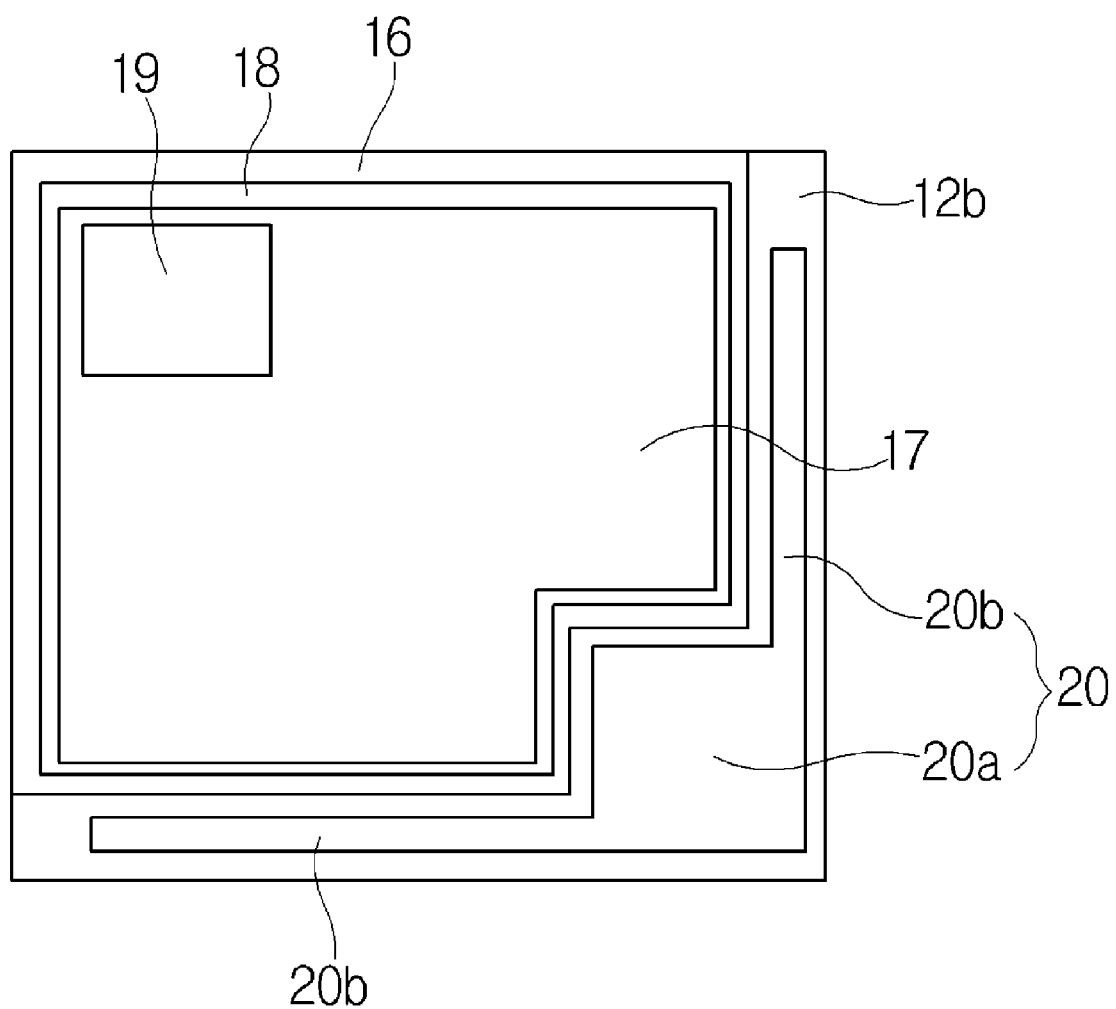
FIG. 2 is a plan view of the light detection device of FIG. 1.
Figure 3:
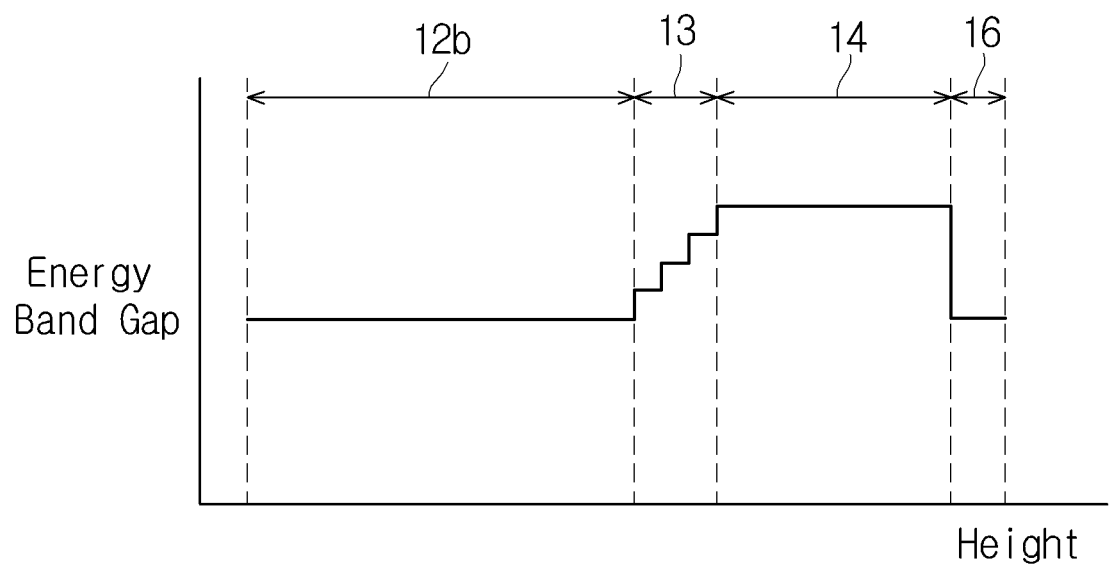
FIG. 3 is a diagram illustrating an energy band of the light detection device of FIG. 1.

FIG. 1 is a cross-sectional view of a light detection device 10, in accordance with an exemplary embodiment of the present invention, and FIG. 2 is a plan view of the light detection device 1. FIG. 3 is a diagram illustrating an energy band of the light detection device 1.

As illustrated in FIG. 1, the light detection device 10 includes a buffer layer 12 formed on a substrate 11, a first band gap change layer 13 formed on a portion of the buffer layer 12, a light absorption layer 14 formed on the first band gap change layer 13, and a top layer 16 formed on the light absorption layer 14.

A Schottky layer 17 is formed on a portion of the top layer 16, and a Schottky fixing layer 18 is formed on the Schottky layer 17. As illustrated in FIGS. 1 and 3, the Schottky fixing layer 18 is wider than the Schottky layer 17, so as to contact a part of the top layer 16 exposed outside of the Schottky layer 17, along a border of the Schottky layer 17.

A first electrode layer 19 is formed on a portion of the Schottky fixing layer 18. A second electrode layer 20 is formed on the buffer layer 12 to be spaced apart from the first band gap change layer 13.

The substrate 11 may be made using sapphire, AlN, SiC, GaN, or Si. The buffer layer 12 includes a low-temperature GaN layer 12a formed on the substrate 11 and a high-temperature GaN layer 12b formed on the low-temperature GaN layer 12a.

When forming the light detection device 10, the substrate 11 is positioned on a susceptor of a reaction tube of a metal organic chemical vapor deposition (MOCVD) device. The pressure in the reaction tube is lowered to 100 torr or less to remove impure gas in the reaction tube.

The surface of the substrate 11 is thermally cleaned by increasing the temperature up to 1100° C. while maintaining the internal pressure of the reaction tube at 100 torr. Then, the temperature is lowered to 550° C., and the low-temperature GaN layer 12a is grown by making Ga source and ammonium ($NH_3$) gas flow to the reaction tube. At this time, the overall gas flow in the reaction tube is determined by the flow rate of hydrogen ($H_2$) gas used as a carrier.

In order to secure the crystalline and optical and electrical characteristics of the high-temperature GaN layer 12b that is grown on the low-temperature GaN layer 12a, the low-temperature GaN layer 12a is generally formed with a thickness of at least 25 nm.

After the low-temperature GaN layer 12a is grown, the temperature of the susceptor is increased up to 1000 to 1100° C., for example, 1050° C., to grow the high-temperature GaN layer 12b. At this time, if the temperature is lower than 1000° C., the optical, electrical, and crystalline characteristics of the high-temperature GaN layer 12b are degraded. If the temperature exceeds 1100° C., the surface roughness is increased, lowering the crystallinity of the high-temperature GaN layer 12b.

The thickness of the high-temperature GaN layer 12b is generally about 2 µm. Although the high-temperature GaN layer 12b shows the n-type characteristics even if doping is not performed, Si doping may be performed for the n-type effect.

The light absorption layer 14 is grown on the high-temperature GaN layer 12b. In order for the light absorption layer 14 to operate as a UVB detection and absorption layer, the light absorption layer 14 should have Al content of 15% or more, and a thickness of 0.1 µm or more.

During the growing under the above-described conditions, due to lattice mismatch and thermal expansion coefficient differences between the light absorption layer 14 and the high-temperature GaN layer 12b, cracks may be produced. This may cause the characteristics and the yield to be degraded.

Accordingly, a high-temperature AlN buffer layer may be formed between the high-temperature GaN layer 12b and the light absorption layer 14, at about 1050° C. The high-temperature AlN buffer layer may suppress cracking. However, the AlN buffer layer becomes nearly an insulating layer, since the energy band gap of the AlN buffer layer is high, that is, about 6 eV. Accordingly, it is difficult to obtain high-quality crystallinity, and the insulating characteristics of the AlN buffer layer may disturb fine current flow.

In order to solve this and/or other problems, the first band gap change layer 13 is formed between the high-temperature GaN layer 12b and the light absorption layer 14. At this time, the first band bap change layer 13 is grown under the same conditions as the growing conditions of the high-temperature GaN layer 12b.

The first band gap change layer 13 may be composed of multiple layers having different Al contents. The first band gap change layer 13 may be formed through lamination of a plurality of AlGaN layers having different Al contents, or may be formed through alternate lamination of a plurality of AlGaN layers having different Al contents and GaN layers. In the case of the light detection device 10, the first band gap change layer 13 may be formed through lamination of a plurality of AlGaN layers having different Al contents.

In this case, in order to minimize the reduction of current flow, due to light energy that is absorbed in the light absorption layer 14, the overall thickness of the first band gap change layer 13 may be equal to or smaller than 50 nm, and the multiple layers that constitute the first band gap change layer 13 may have the same thickness. However, the multiple layers may have different thicknesses, and the number of layers and the thicknesses of the respective layers may be selectively determined, as needed.

After the first band gap change layer 13 is grown, the light absorption layer 14 that is formed of an $Al_xGa_{1-x}N$ (0<x<0.7) layer is grown. That is, an AlGaN layer is formed by supplying an Al source under the growing conditions of the high-temperature GaN layer 12b, and the formed AlGaN layer operates as the light absorption layer 14.

The light absorption layer 14 is grown with a thickness of 0.1 to 0.5 μm. For example, the light absorption layer 14 may have a thickness of about 0.2 μm, in consideration of the influence of cracks or the like.

Further, the energy band gap of the light absorption layer 14 may differ, depending on the wavelength region of light to be absorbed. The light absorption layer 14 having a desired energy band gap can be selectively grown through proper adjustment of Al content.

As illustrated in FIG. 3, the energy band gap of the light absorption layer 14 that is formed of an $Al_xGa_{1-x}N$ (0<x<0.7) layer is higher than the energy band gap of the high-temperature GaN layer 12b. The first band gap change layer 13 that is adjacent to the high-temperature GaN layer 12b has a lower energy band gap, and the first band gap change layer 13 that is adjacent to the light absorption layer 14 has a higher energy band gap.

That is, the energy band gap of the first band gap change layer 13 becomes higher going from a lower layer that is adjacent to the high-temperature GaN layer 12b to an upper layer that is adjacent to the light absorption layer 14. As such, a plurality of AlGaN layers constituting the first band gap change layer 13 are configured so that Al content of the upper layer becomes higher than Al content of the lower layer.

After the light absorption layer 14 is grown, the top layer 16 that is formed of a $p-In_zGa_{1-z}N$ (0<z<1) layer doped with Mg is grown on the light absorption layer 14. The top layer 16 is configured to facilitate the Schottky junction of the Schottky layer 17 described later.

The thickness of the top layer 16 is generally equal to or smaller than 10 nm. If the top layer 16 is too thick, the top layer 16 may show both the PN characteristics and the Schottky characteristics at the same time. Further, Mg doping concentration of the top layer 16 may be lower than $5 \times 10^7/cm^3$ during hall measurement.

The top layer 16 that is formed of a $p-In_zGa_{1-z}N$ (0<z<1) layer is generally grown at about 800° C. This is because In composition tends to differ depending on the growth temperature, even if the same In source is supplied. Further, it is also possible that the top layer 16 is grown to have a super lattice structure of p-GaN/InGaN.

After the top layer 16 is grown, the top layer 16, the light absorption layer 14, and the first band gap change layer 13 are etched through dry etching. The second electrode layer 20 is formed by depositing, for example, Cr/Ni/Au on the high-temperature GaN layer 12b that is exposed through the etching. In this case, the second electrode layer 20 and the high-temperature GaN layer 12b are configured to have ohmic characteristics. It is also possible to etch even a part of the high-temperature GaN layer 12b during the etching.

When the second electrode layer 20 is composed of Cr/Ni/Au, the electrode characteristics differ depending on the thicknesses thereof. However, the overall thickness of the second electrode layer 20 is generally equal to or larger than 400 nm.

The second electrode layer 20 includes a body portion 20a that is formed on a corner portion of the high-temperature GaN layer 12b, spaced apart from the first band gap change layer 13, and a pair of wing portions 20b extending from the body portion 20a along the edge of the first band gap change layer 13. The structure of the second electrode layer 20 prevents a peeling phenomenon of the second electrode layer 20, which is due to the stress during wire bonding.

After the second electrode 20 is formed, the Schottky layer is formed on a portion of the top layer 16, so that the top layer 16 below the Schottky layer 17 is partially exposed to along the border of the Schottky layer 17. In this case, the exposed part of the top layer 16 is covered by the Schottky fixing layer 18 described later.

Here, the Schottky layer 17 may be made of, for example, any one of ITO, ATO, Pt, W, Ti, Pd, Ru, Cr, and Au. Particularly, if the Schottky layer 17 is made of ITO having superior UV light permeability, the light permeability, the Schottky characteristics, and the reaction degree of the light detection device are improved.

Further, in consideration of the UV light permeability and the Schottky characteristics, the thickness of the Schottky layer 17 is generally equal to or smaller than 10 nm.

The Schottky fixing layer 18 is formed on the Schottky layer 17, and covers a part of the top layer 16 that is exposed along the border of the Schottky layer 17. That is, the Schottky fixing layer 18 comes in contact with both the Schottky layer 17 and the part of the top layer 16, to fix the Schottky layer 17 on the top layer 16. Thus, the peeling phenomenon of the Schottky layer 17, which is due to the stress during the wire bonding, is prevented to improve the reliability and yield of the light detection device 10. The Schottky fixing layer 18 may be made of any one of ITO, ATO, Pt, W, Ti, Pd, Ru, Cr, and Au.

The first electrode layer 19 is formed on a portion of the Schottky fixing layer 18. The first electrode layer 19 may be formed mainly using, for example, Ni/Au.

Further, the region where the first electrode layer 19 is formed on the Schottky fixing layer 18 is opaque, and thus, is unable to serve as the Schottky layer 17. Accordingly, the first electrode layer 19 is formed with the minimum area for wire bonding. The first electrode layer 19 may be formed adjacent to the corner portion of the Schottky fixing layer 18, so that the first electrode layer 19 faces the second electrode layer 20 in a diagonal direction. In other words, body portion 20a and the first electrode layer 19 may be disposed on opposing corners of the light detection device 10.

Figure 4:
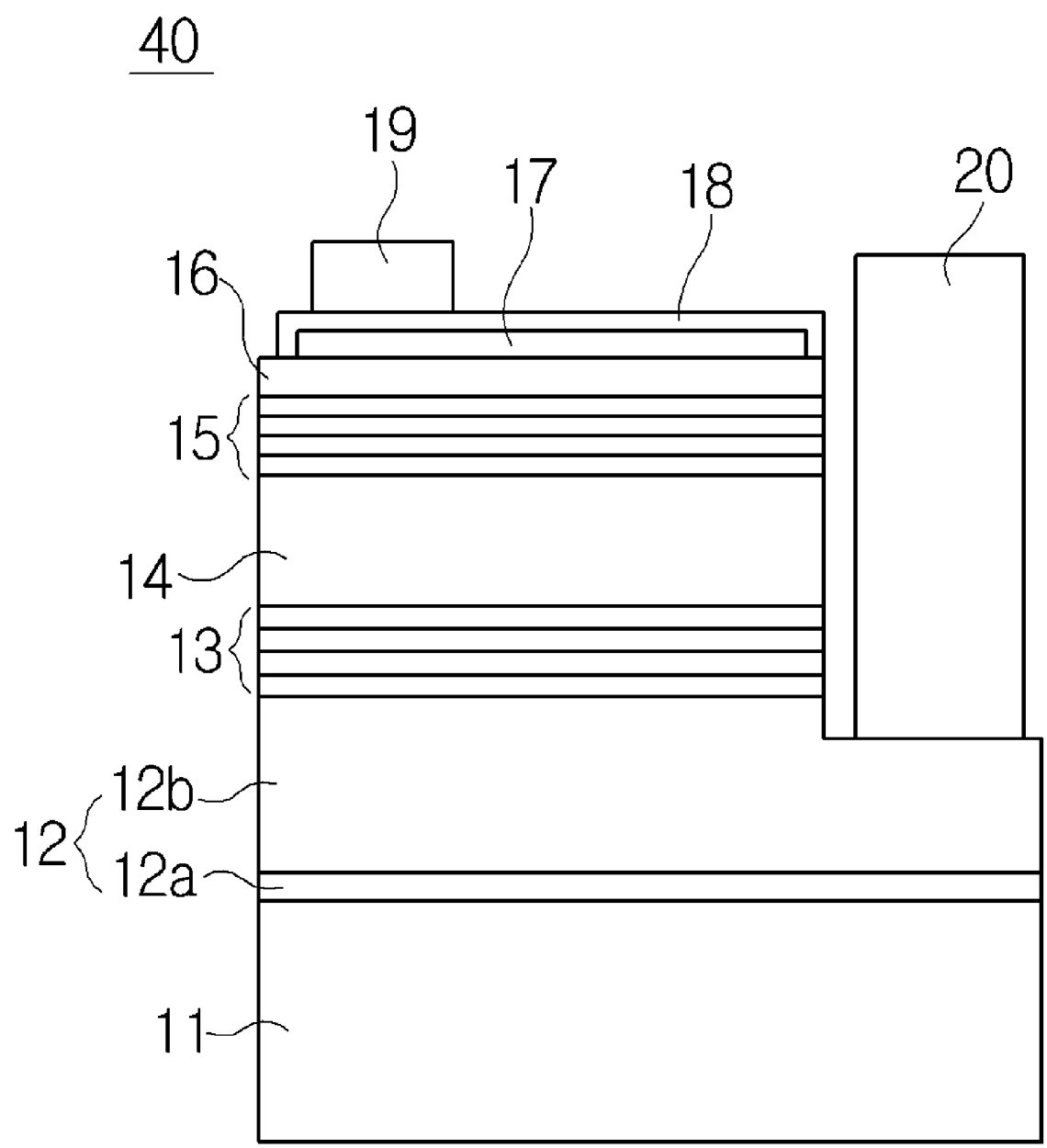
FIG. 4 is a cross-sectional view of a light detection device in accordance with an exemplary embodiment of the present invention.
Figure 5:
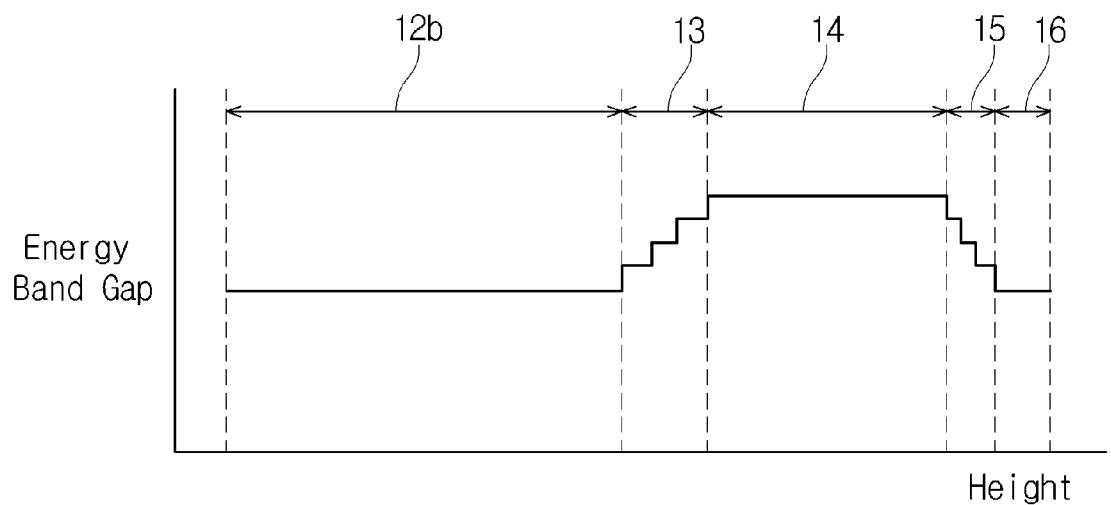
FIG. 5 is a diagram illustrating an energy band of the light detection device of FIG. 4.

FIG. 4 is a cross-sectional view of a light detection device 40 in accordance with various embodiments of the present invention. FIG. 5 is a diagram illustrating an energy band of the light detection device 40.

Referring to FIGS. 4 and 5, the light detection device 40 has substantially the same configuration as the light detection device 10. Accordingly, the same reference numbers will be used for similar elements, and only the differences therebetween will be described in detail.

The light detection device 40, a second band gap change layer 15 is formed between the light absorption layer 14 and the top layer 16. The second band gap change layer 15 prevents the occurrence of a band well, due to an abrupt energy band gap change between the top layer 16 and the light absorption layer 14. This facilitates current flow and improves the crystalline characteristics of the top layer 16, by reducing crystalline defects.

The second band gap change layer 15 is grown, under the same growing conditions as the high-temperature GaN layer 12b. The second band gap change layer 15 includes a plurality of layers having different energy band gaps, in accordance with the content change of an Al source.

That is, the second band gap change layer 15 is composed of multiple layers having different Al contents. The second band gap change layer 15 may be formed through lamination of AlGaN layers having different Al contents, or may be formed through alternate lamination of AlGaN layers having different Al contents and GaN layers.

In the case of the light detection device 40, the second band gap change layer 15 is formed through lamination of the AlGaN layers having different Al contents. If the second band gap change layer 15 is too thick, it operates as a depletion layer that is formed by the Schottky effect, to exert an influence as a separate light absorption layer. Accordingly, the second band gap change layer 15 should generally have a small thickness. For example, the thickness of the second band gap change layer 15 may be equal to or smaller than 20 nm.

The layers of the second band gap change layer 15 may have the same thickness. However, the layers may have different thicknesses, and the number of the layers and the thicknesses thereof may be properly selected, as needed.

As illustrated in FIG. 5, the energy band gap of the top layer 16 that is formed of p-$In_zGa_{1-z}N$ (0<z<1) is lower than the energy band gap of the light absorption layer 14 that is formed of $Al_xGa_{1-x}N$ (0<x<0.7). The second band gap change layer 15 that is adjacent to the light absorption layer 14 has a relatively high energy band gap, and the second band gap change layer 15 that is adjacent to the top layer 16 has a relatively low energy band gap.

That is, the energy band gap of the second band gap change layer 15 becomes lower going from a lower layer that is adjacent to the light absorption layer 14 to an upper layer that is adjacent to the top layer 16. AlGaN layers constituting the second band gap change layer 15 are configured so that Al content of the upper layers is lower than the Al content of the lower layers.

Figure 6:
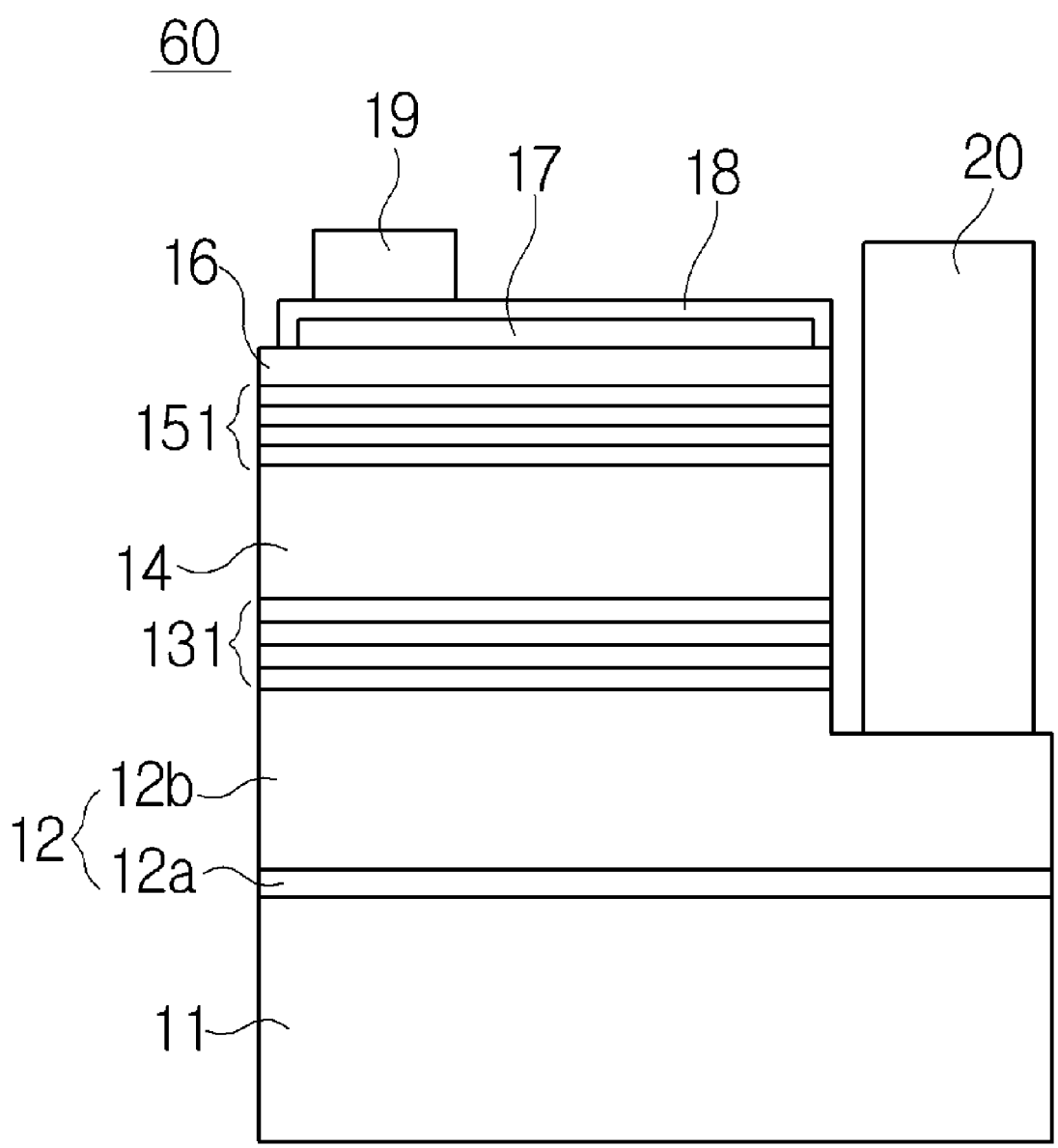
FIG. 6 is a cross-sectional view of a light detection device in accordance with an exemplary embodiment of the present invention.
Figure 7:
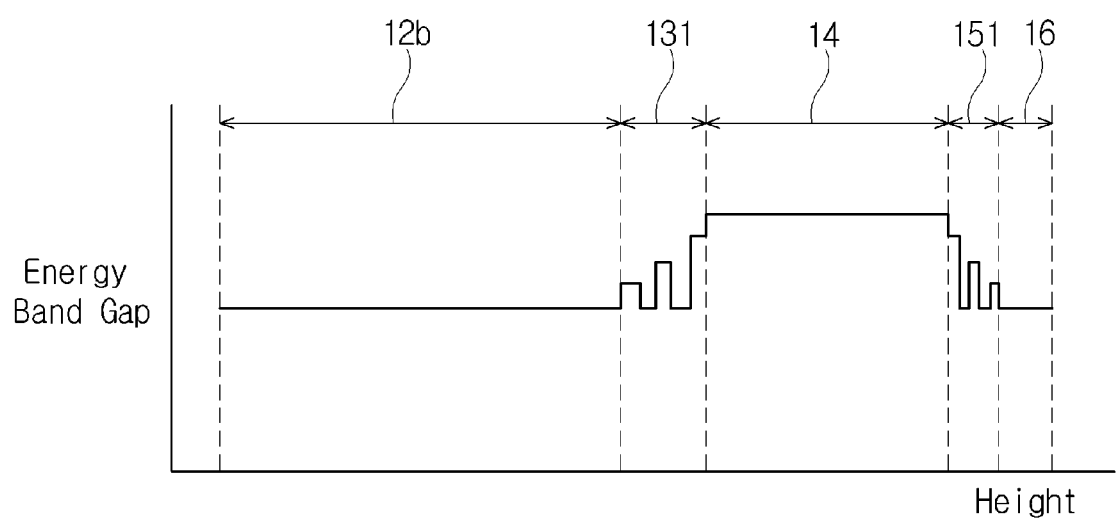
FIG. 7 is a diagram illustrating an energy band of the light detection device of FIG. 6.

FIG. 6 is a cross-sectional view of a light detection device 60 in accordance with various embodiments of the present invention. FIG. 7 is a diagram illustrating an energy band of the light detection device 60.

Referring to FIG. 6, the light detection device 60 has substantially the same configuration as the light detection device 30. Accordingly, the same reference numbers will be used for similar elements, and only the differences therebetween will be described in detail.

The light detection device 60 includes a first band gap change layer 131 and a second band gap change layer 151 that are formed through alternate lamination of AlGaN layers having different Al contents and GaN layers. That is, the first band gap change layer 131 and the second band gap change layer 151 include AlGaN layers and GaN layers that are alternately laminated.

In this case, Al contents of the AlGaN layers constituting the first band gap change layer 131 become higher going from the lower layer that is adjacent to the high-temperature GaN layer 12b, to the upper layer that is adjacent to the light absorption layer 14. Further, Al contents of the AlGaN layers constituting the second band gap change layer 151 become lower going from the lower layer that is adjacent to the light absorption layer 14, to the upper layer that is adjacent to the top layer 16.

Figure 8:
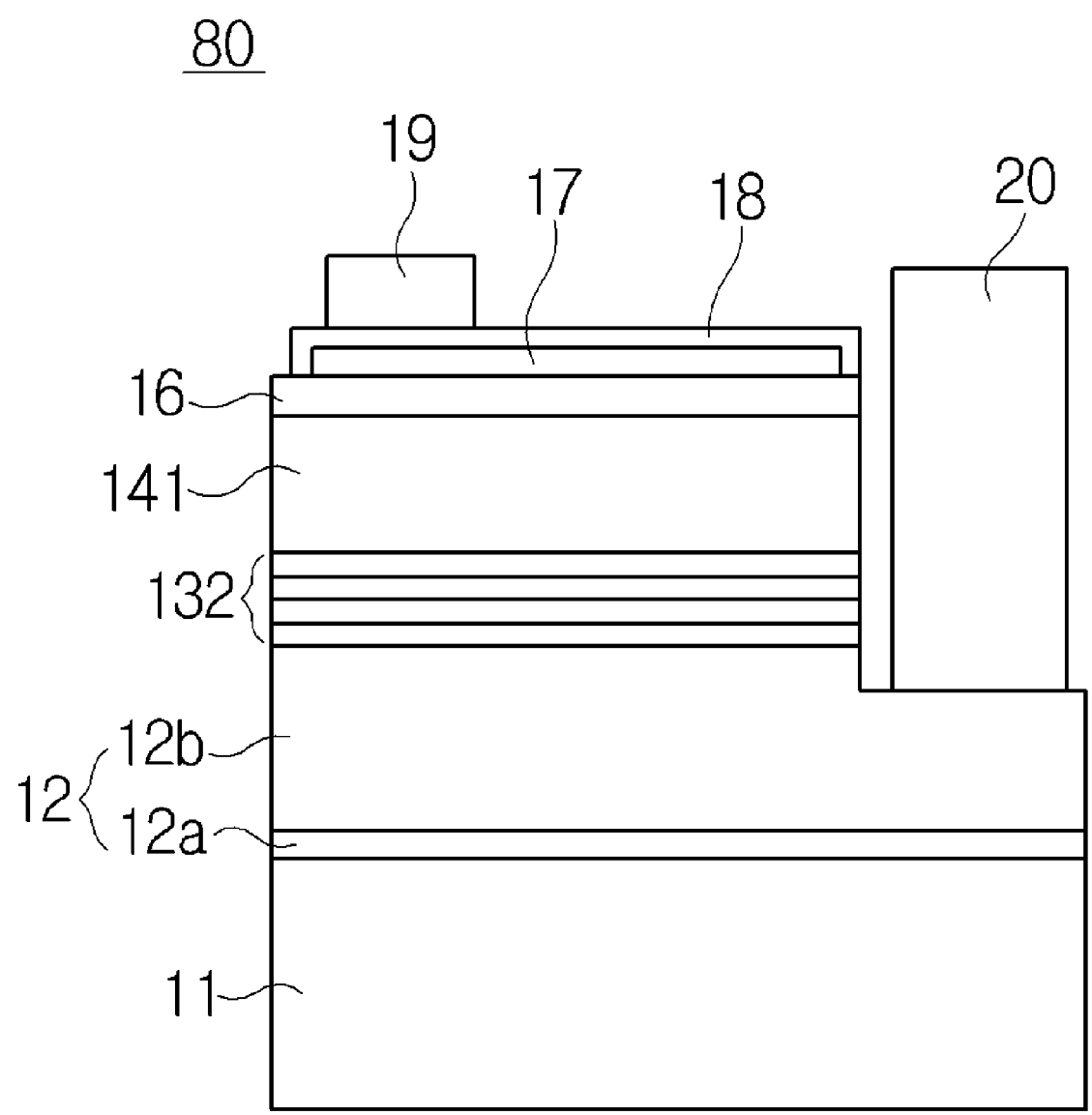
FIG. 8 is a cross-sectional view of a light detection device in accordance with an exemplary embodiment of the present invention.
Figure 9:
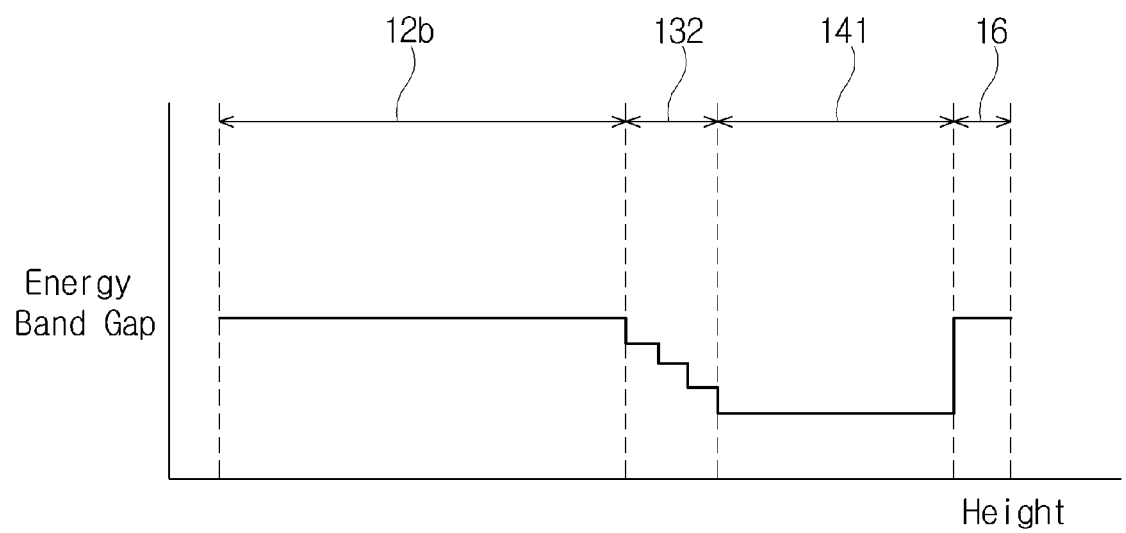
FIG. 9 is a diagram illustrating an energy band of the light detection device of FIG. 8.

FIG. 8 is a cross-sectional view of a light detection device 80, in accordance with various embodiments of the present invention, and FIG. 9 is a diagram illustrating an energy band of the light detection device 80. The light detection device 80 has substantially the same configuration as the light detection device 10. Accordingly, the same reference numbers will be used for similar elements, and only the differences therebetween will be described in detail.

Referring to FIG. 8, the light detection device 80 includes a light absorption layer 141 formed of $In_yGa_{1-y}N$ (0<y<0.5). The energy band gap of the light absorption layer 141 is lower than the energy band gaps of the high-temperature GaN layer 12b and the top layer 16.

A first band gap change layer 132 is formed of an InGaN layer. The first band gap change layer 132 that is adjacent to the high-temperature GaN layer 12b has a relatively high energy band gap, and the first band gap change layer 132 that is adjacent to the light absorption layer 141 has a relatively low energy band gap. The light absorption layer 141 is formed of $In_yGa_{1-y}N$ (0<y<0.5), and the first band bap change layer 132 is formed through lamination of InGaN layers having different In contents.

The energy band gap of the light absorption layer 141 is lower than the energy band gap of the high-temperature GaN layer 12b. In the InGaN layers of the first band gap change layer 132, the In content of the lower layer that is adjacent to the high-temperature GaN layer 12b is higher than the In content of the upper layer that is adjacent to the light absorption layer 141.

Figure 10:
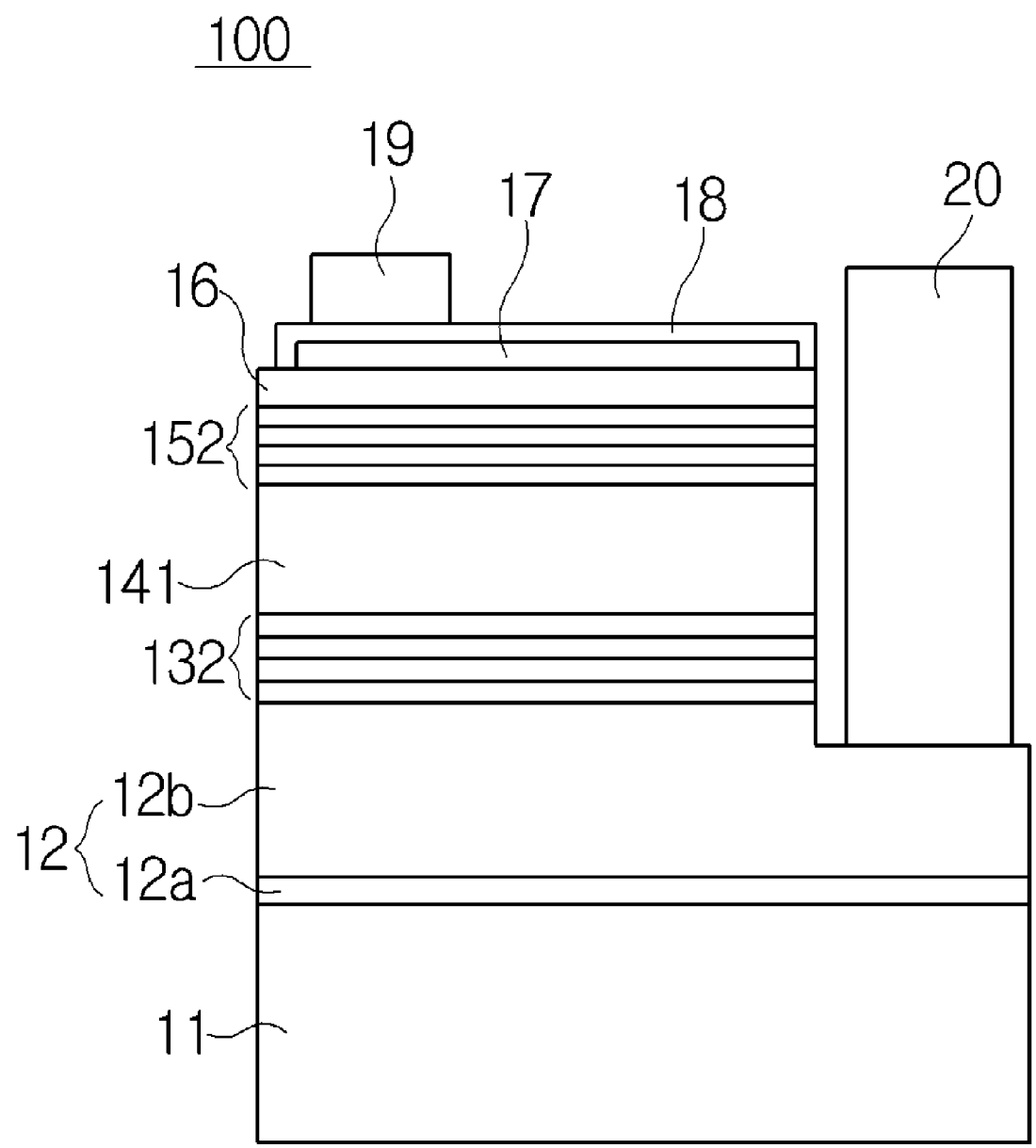
FIG. 10 is a cross-sectional view of a light detection device in accordance with an exemplary embodiment of the present invention.
Figure 11:
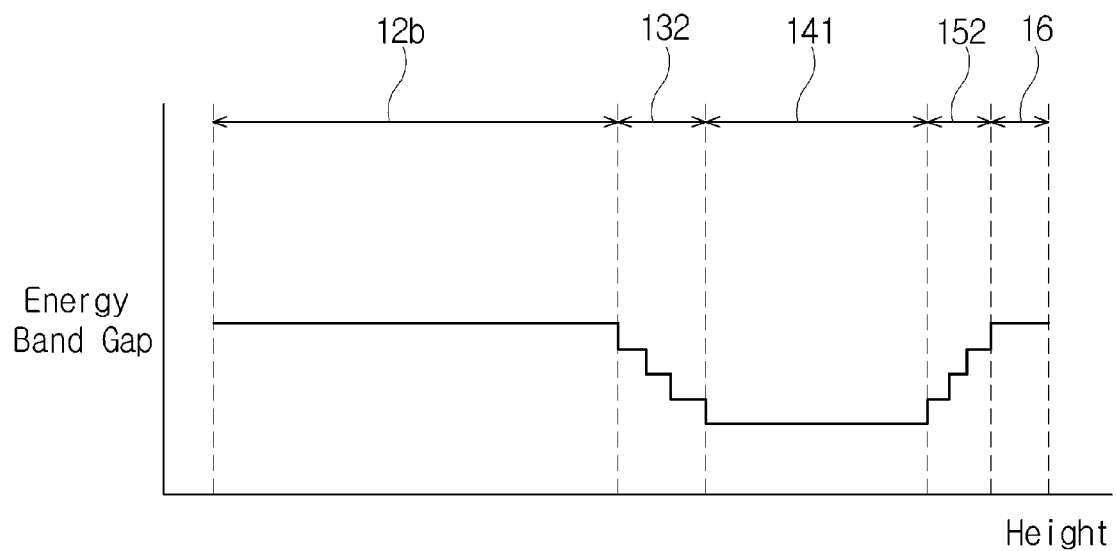
FIG. 11 is a diagram illustrating an energy band of the light detection device of FIG. 10.

FIG. 10 is a cross-sectional view of a light detection device 100 in accordance with various embodiments of the present invention. FIG. 11 is a diagram illustrating an energy band of the light detection device 100. The light detection device 100 has substantially the same configuration as the light detection device 80. Accordingly, the same reference numbers will be used for similar elements, and only the differences therebetween will be described in detail.

Referring to FIG. 10, the light detection device 100 includes a second band gap change layer 152 formed between a light absorption layer 141 and the top layer 16. The second band gap change layer 152 includes InGaN layers. The second band gap change layer 152 prevents the occurrence of a band well due to an abrupt energy band gap change between the top layer 16 and the light absorption layer 141. The second band gap change layer 152 facilitates current flow, and improves the crystalline characteristics of the top layer 16, through a reduction of crystalline defects.

The second band gap change layer 152 is grown, under the same growing conditions as the high-temperature GaN layer 12b. The second band gap change layer 152 includes layers having different energy band gaps in accordance with the content change of an In source. In the light detection device 100, the second band gap change layer 152 is formed through lamination of the AlGaN layers having different In contents.

As illustrated in FIG. 11, the energy band gap of the top layer 16 that is formed of p-$In_zGa_{1-z}N$ (0<z<1) is higher than the energy band gap of the light absorption layer 141 that is formed of $In_yGa_{1-y}N$ (0<x<0.5). Accordingly, the energy band gap of the second band gap change layer 152 becomes higher from the lower layer that is adjacent to the light absorption layer 141 to the upper layer that is adjacent to the top layer 16. AlGaN layers constituting the second band gap change layer 152 are configured so that an In content of the upper layers is lower than In content of the lower layers.

Figure 12:
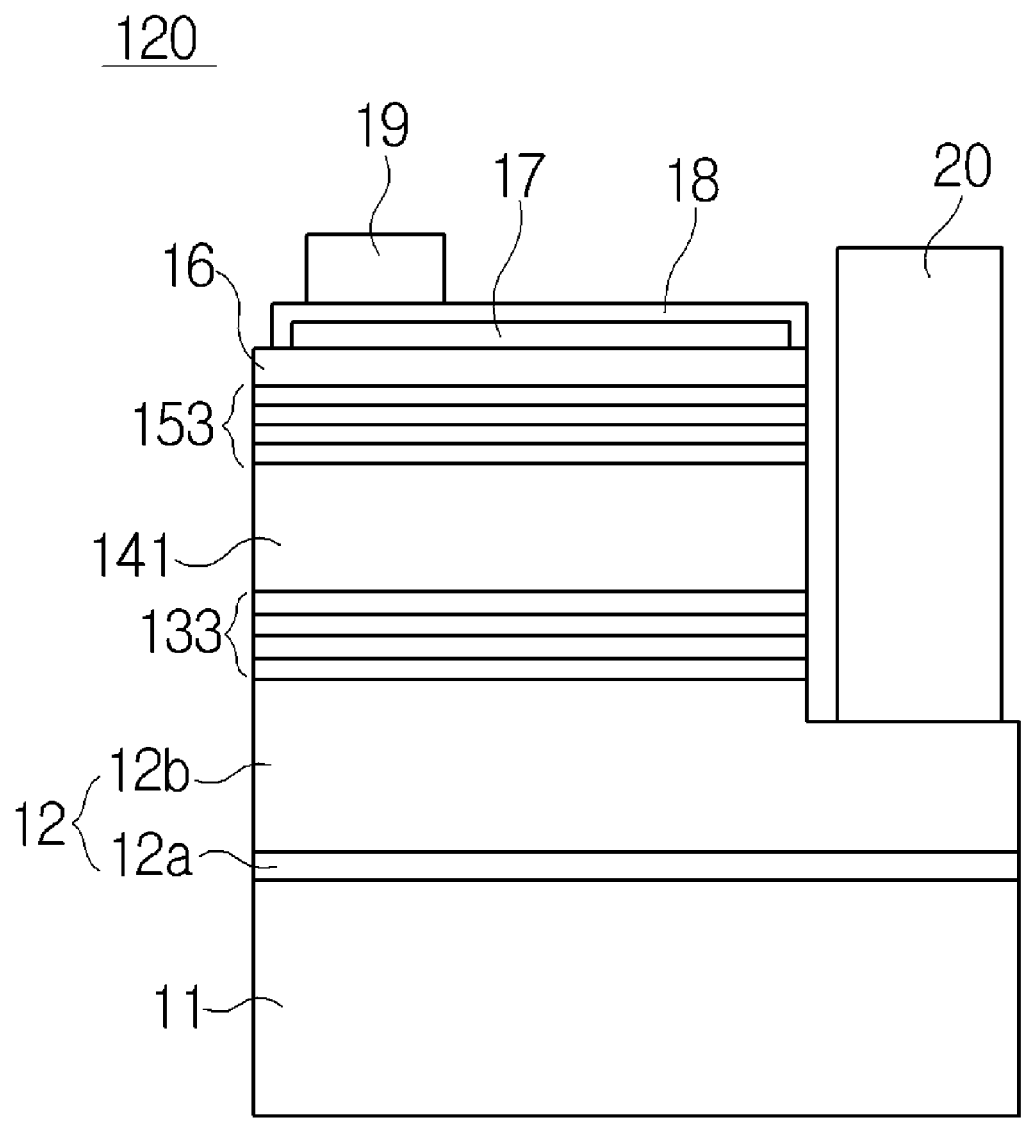
FIG. 12 is a cross-sectional view of a light detection device in accordance with an exemplary embodiment of the present invention.
Figure 13:
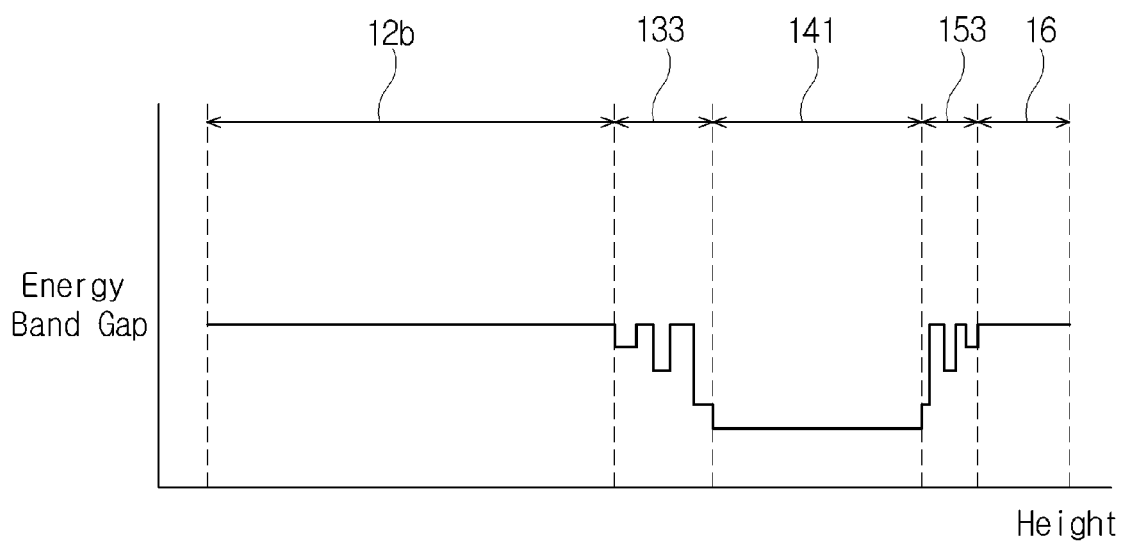
FIG. 13 is a diagram illustrating an energy band of the light detection device of FIG. 12.

FIG. 12 is a cross-sectional view of a light detection device 120 in accordance with various embodiments of the present invention. FIG. 13 is a diagram illustrating an energy band of the light detection device 120. The light detection device 120 has substantially the same configuration as the light detection device 100. Accordingly, the same reference numbers will be used for similar elements, and only the differences therebetween will be described in detail.

The light detection device 120 includes a first band gap change layer 133 and a second band gap change layer 153 that are formed of InGaN/GaN layers. The first band gap change layer 133 and the second band gap change layer 153 are formed through alternate lamination of InGaN layers having different In contents and GaN layers. That is, the first band gap change layer 133 and the second band gap change layer 153 include InGaN layers and GaN layers that are alternately laminated.

In contents of the InGaN layers of the first band gap change layer 133 become higher from the lower layer that is adjacent to the high-temperature GaN layer 12b to the upper layer that is adjacent to a light absorption layer 141. In contents of the InGaN layers of the second band gap change layer 153 become lower from the lower layer that is adjacent to the light absorption layer 141 to the upper layer that is adjacent to the top layer 16.

While the present invention has been described with respect to the specific embodiments, it will be apparent to those skilled in the art that various changes and modifications may be made without departing from the spirit and scope of the invention as defined in the following claims.

What is claimed is:

1. A light detection device comprising:
a substrate;
a buffer layer disposed on the substrate;
a first band gap change layer disposed directly on a first portion of the buffer layer less than an entire upper surface of the buffer layer;
a second electrode layer disposed directly on a second portion of the buffer layer less than the entire upper surface of the buffer layer, the second electrode layer being spaced apart from the first band gap change layer;
a light absorption layer disposed on the first band gap change layer;
a Schottky layer disposed on a portion of the light absorption layer; and
a first electrode layer disposed on a portion of the Schottky layer;
wherein the first band gap change layer is configured to transmit current from the light absorption layer to the second electrode layer.

2. The light detection device of claim 1, further comprising a top layer disposed between the light absorption layer and the Schottky layer,
wherein the Schottky layer is disposed on a portion of the top layer.

3. The light detection device of claim 2, further comprising a Schottky fixing layer completely covering the Schottky layer and contacting the top layer.

4. The light detection device of claim 1, wherein the second electrode layer is configured to form an ohmic junction with the buffer layer.

5. The light detection device of claim 1, wherein the substrate comprises any one of a sapphire substrate, an SiC substrate, a GaN substrate, an AlN substrate, and an Si substrate.

6. The light detection device of claim 1, wherein the buffer layer comprises a low-temperature GaN layer disposed on the substrate and a high-temperature GaN layer disposed on the low-temperature GaN layer.

7. The light detection device of claim 1, wherein the first band gap change layer comprises stacked AlGaN layers having different Al contents.

8. The light detection device of claim 1, wherein the first band gap change layer comprises AlGaN layers having different Al contents and GaN layers that are alternately stacked with the AlGaN layers.

9. The light detection device of claim 7, wherein:
an energy band gap of the light absorption layer is higher than an energy band gap of the buffer layer; and
Al contents of the AlGaN layers of the first band gap change layer increase as a distance from the buffer layer increases.

10. The light detection device of claim 9, wherein the light absorption layer comprises $Al_xGa_{1-x}N$ ($0<x<0.7$).

11. The light detection device of claim 1, wherein the first band gap change layer comprises stacked InGaN layers having different In contents.

12. The light detection device of claim 1, wherein the first band gap change layer comprises InGaN layers having different In contents and GaN layers alternately stacked with the InGaN layers.

13. The light detection device of claim 11, wherein:
an energy band gap of the light absorption layer is lower than an energy band gap of the buffer layer; and
In contents of the AlGaN layers of the first band gap change layer increase as a distance from the buffer layer increases.

14. The light detection device of claim 13, wherein the light absorption layer comprises $In_yGa_{1-y}N$ ($0<y<0.5$).

15. The light detection device of claim 2, further comprising a second band gap change layer disposed between the light absorption layer and the top layer.

16. The light detection device of claim 15, wherein the second band gap change layer comprises stacked AlGaN layers having different Al contents.

17. The light detection device of claim 15, wherein the second band gap change layer comprises AlGaN layers having different Al contents and GaN layers alternately stacked with the AlGaN layers.

18. The light detection device of claim 16, wherein:
an energy band gap of the top layer is lower than an energy band gap of the light absorption layer; and
Al contents of the AlGaN layers of the second band gap change layer decrease as a distance from the light absorbing layer increases.

19. The light detection device of claim 18, wherein:
the top layer comprises $p-In_zGa_{1-z}N$ ($0<z<1$) doped with Mg; and
the light absorption layer comprises $Al_xGa_{1-x}N$ ($0<x<0.7$).

20. The light detection device of claim 15, wherein the second band gap change layer comprises stacked InGaN layers having different In contents.

21. The light detection device of claim 15, wherein the second band gap change layer comprises InGaN layers having different In contents and GaN layers alternately stacked with the InGaN layers.

22. The light detection device of claim 20, wherein:
an energy band gap of the top layer is higher than an energy band gap of the light absorption layer; and
In contents of the InGaN layers of the second band gap change layer decrease as a distance from the light absorbing layer increases.

23. The light detection device of claim 22, wherein:
the top layer comprises p-$In_zGa_{1-z}N$ ($0<z<1$) doped with Mg; and
the light absorption layer comprises $In_yGa_{1-y}N$ ($0<y<0.5$).

24. The light detection device of claim 1, wherein the first band gap change layer has a thickness larger than 0 and equal to or smaller than 50 nm.

25. The light detection device of claim 1, wherein the light absorption layer has a thickness of 0.1 to 0.5 μm.

26. The light detection device of claim 15, wherein the second band gap change layer has a thickness larger than 0 and equal to or smaller than 20 nm.

27. The light detection device of claim 2, wherein the top layer has a thickness larger than 0 and equal to or smaller than 10 nm.

28. The light detection device of claim 1, wherein the Schottky layer comprises any one of ITO, ATO, Pt, W, Ti, Pd, Ru, Cr, and Au.

29. The light detection device of claim 3, wherein the Schottky fixing layer comprises any one of ITO, ATO, Pt, W, Ti, Pd, Ru, Cr, and Au.

* * * * *